United States Patent [19]
Hong et al.

[11] Patent Number: 6,093,959
[45] Date of Patent: Jul. 25, 2000

[54] LEAD FRAME HAVING SUPPORTERS AND SEMICONDUCTOR PACKAGE USING SAME

[75] Inventors: Joon Ki Hong, Choongchungbook-Do; Sun Dong Kim, Seoul, both of Rep. of Korea

[73] Assignee: LG Semicon Co., Ltd., Cheongju, Rep. of Korea

[21] Appl. No.: 08/785,019

[22] Filed: Jan. 17, 1997

[30] Foreign Application Priority Data

Apr. 4, 1996 [KR] Rep. of Korea ...................... 96-10175

[51] Int. Cl.[7] .......................... H01L 23/495; H01L 23/22
[52] U.S. Cl. .......................... 257/692; 257/666; 257/667; 257/668; 257/669; 257/687; 257/674; 257/676
[58] Field of Search ..................................... 257/666, 667, 257/668, 669, 670, 787, 674, 776

[56] References Cited

U.S. PATENT DOCUMENTS

| | | | |
|---|---|---|---|
| 5,250,839 | 10/1993 | Katoh et al. | 257/666 |
| 5,623,163 | 4/1997 | Izumi | 257/667 |
| 5,789,806 | 8/1998 | Chua et al. | 257/676 |

*Primary Examiner*—Carl Whitehead, Jr
*Assistant Examiner*—Matthew E. Warren
*Attorney, Agent, or Firm*—Fleshner & Kim

[57] ABSTRACT

A lead frame and a semiconductor chip package includes supporters on a lead frame paddle and tiebars using the same for preventing undesired paddle bending which may occur due to the pressure of an epoxy molding compound during the molding process. The supports also allow improved heat dissipation during the molding process of the semiconductor chip package and mounting process of the package onto a printed circuit board.

27 Claims, 3 Drawing Sheets

LEAD FRAME HAVING SUPPORTERS AND SEMICONDUCTOR PACKAGE USING SAME

TECHNICAL FIELD

The present invention relates to a semiconductor package, and more particularly, to a lead frame having supporters on at least one of the paddles of the lead frame and tiebars.

BACKGROUND ART

Referring to FIG. 1 showing a conventional lead frame which is employed for forming a Quad Flat Package (hereinafter, called QFP), the lead frame 2 has a hole (1a, 1b, 1c, 1d) formed in each corner surface of a rail 1 and has a thin plate shape. The lead frame 2 includes a paddle 3 formed in a center thereof and has a semiconductor chip 4 mounted on the paddle 3, multiple tiebars (5a, 5b, 5c, 5d) sustaining the paddle 3, and a plurality of leads 6 with one end of each lead approaching the paddle 3 and the other end of each lead connected to the rail 1.

A semiconductor package manufacturing process using the lead frame 2 includes a step for mounting the semiconductor chip 4 on the paddle 3 of the lead frame 2, then a step for performing a wire bonding process. The chip pads formed on the semiconductor chip 4 are connected to one end of respective ones of the plurality of leads 6 using metallic wires 7. The area including the semiconductor chip 4 and the plurality of leads 6, as shown by the broken line, are encapsulated using an epoxy molding compound. As shown in FIG. 2, the paddle 3 and the plurality of leads 6 are formed in the same plane. The reference numeral 8, referring to a line, designates a molded structure made of an epoxy molding compound.

The QFP, however, has a tendency of lacking strength in terms of the tiebars sustaining the semiconductor chip on the surface of the paddle. A semiconductor package fabricated using a lead frame for forming a QFP tends to suffer undesired paddle bending due to the pressure of the epoxy molding compound, which may occur when the fused epoxy molding compound is poured into a mold. As a result, the upper surface of a chip and/or the lower surface of the paddle may be exposed through the surface of the chip package. Further, the wire bonding in the chip package may weaken, resulting in a poor quality chip package. Moreover, the steam generated during the molding process of the semiconductor package is difficult to exhaust therefrom, and it is difficult to externally dissipate the heat generated during a mounting operation onto a printed circuit board.

DISCLOSURE OF THE INVENTION

An advantage of the present invention is in preventing a paddle of a lead frame from bending.

Another advantage of the present invention is in improving the heat dissipation of a package.

According to the present invention, the foregoing and other advantages are achieved in part by a lead frame for an integrated chip package, comprising: a paddle for mounting the integrated chip; a plurality of tiebars connected to the paddle; a plurality of leads for conductive connection to the integrated chip; and a plurality of supporters for preventing bending of the paddle such that the paddle is maintained on a substantially horizontal plane with the plurality of leads.

The present invention can also be achieved in part by an integrated chip package, comprising: a) an integrated chip; b) a lead frame having i) a paddle for mounting the integrated chip, ii) a plurality of tiebars connected to the paddle, iii) a plurality of leads, and iv) a plurality of supporters for preventing bending of the paddle such that the paddle remains substantially horizontal with the plurality of leads; c) means for conductive connection between the integrated chip and the plurality of leads; and d) a body member for packaging the chip, lead frame and connection means.

The advantages and others can also be achieved in part by a lead frame for a semiconductor package, comprising: a rail; a paddle positioned in a center of the lead frame; a plurality of tiebars connecting the paddle to the rail; a plurality of leads each having one end thereof approaching the paddle and another end thereof connected to the rail; and a plurality of first supporters extended outwardly from each side of the paddle.

The present invention can also be achieved by a semiconductor chip package using a lead frame having supporters, comprising: a semiconductor chip; a lead frame including a rail, a paddle positioned in a center of the frame with a semiconductor chip mounted on a surface of the paddle, a plurality of tiebars connecting the paddle to the rail, a plurality of leads each having one end thereof approaching the paddle and having another end thereof connected to the rail, and a plurality of first supporters extended outwardly from each side of the paddle; metallic wires electrically connecting the semiconductor chip and the plurality of leads; and an epoxy body structure packaging the semiconductor chip, the metallic wires and the plurality of leads, wherein a part of each of the first supporters on a lower surface thereof is exposed.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
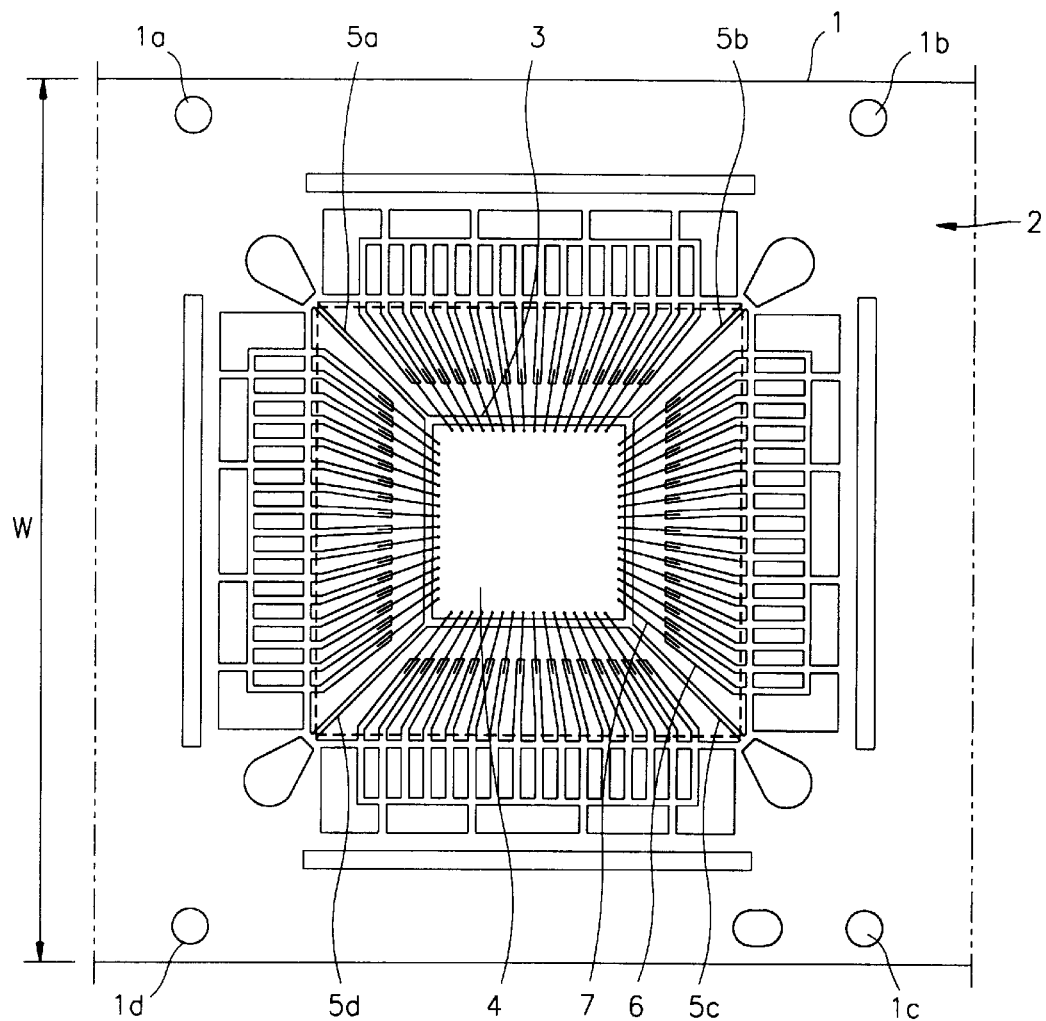
FIG. 1 is a plan view showing a lead frame which is employed for forming a conventional Quad Flat Package.
Figure 2:
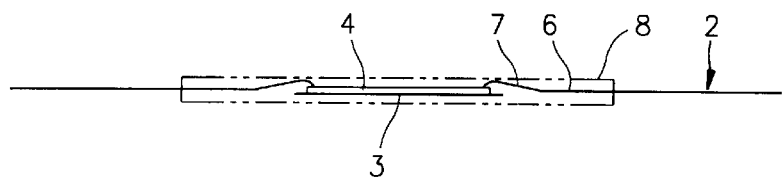
FIG. 2 is a front view of the lead frame of FIG. 1.
Figure 3:
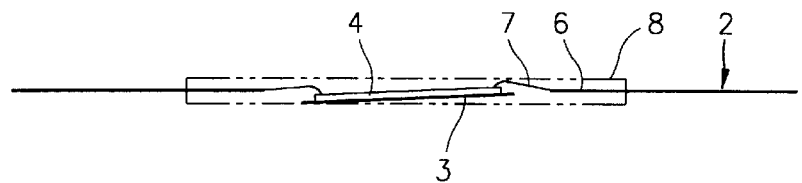
FIG. 3 is a front view of the lead frame of FIG. 2 illustrating the bending of the paddle.
Figure 4:
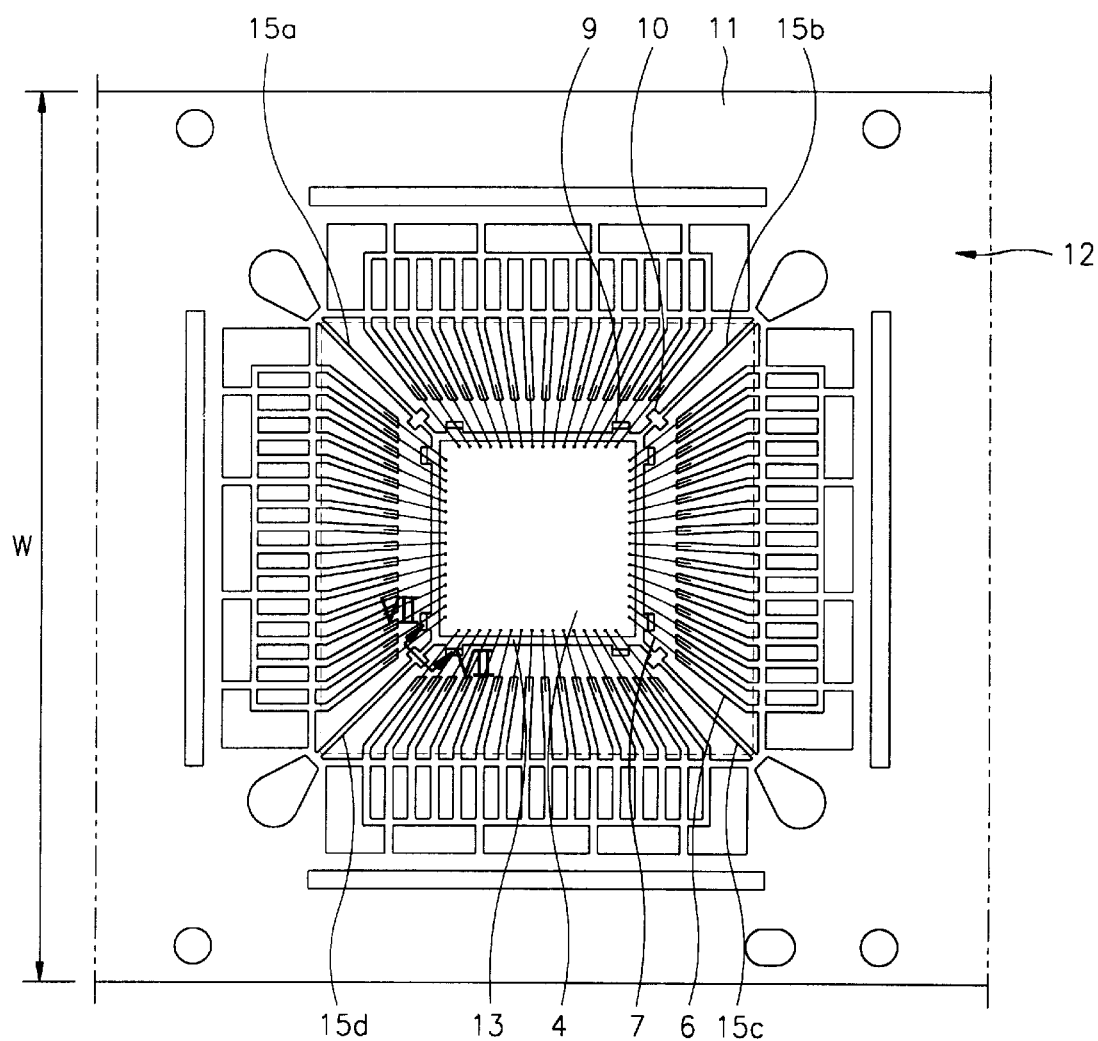
FIG. 4 is a plan view of a lead frame of a semiconductor chip package in accordance with the present invention.
Figure 5:
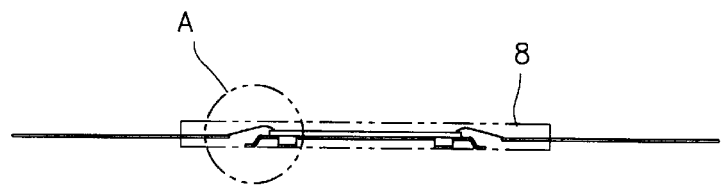
FIG. 5 is a front view of the lead frame of FIG. 4.
Figure 6:
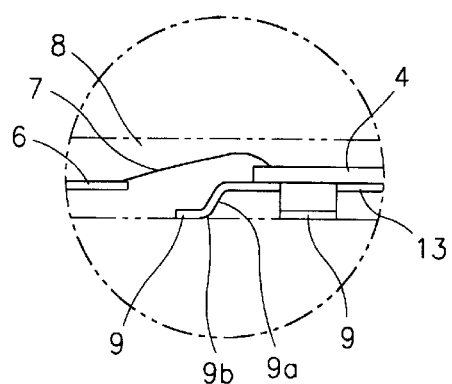
FIG. 6 is an enlarged view of part A of the lead frame illustrated in FIG. 5.

FIG. 4 is a plan view which shows a lead frame 12 having supporters in accordance with the present invention, and FIG. 5 is a front view along I—I of the lead frame shown in FIG. 4 having a magnified view of part A thereof. The lead frame 12, as shown in FIGS. 4 and 5, and 6 is provided with a rail 11, a paddle 13 positioned in the center of the lead frame 12 with a semiconductor chip 4 being mounted thereon, multiple tiebars (15a, 15b, 15c, 15d) connecting the paddle 13 to the rail 11, and a plurality of leads 6 each with one end thereof approaching the paddle 13 and the other end thereof connected to the rail 11.

Additionally, a plurality of first supporters 9 are extended from each side of the paddle 13 such that the paddle 13 is not easily bent and the steam and heat generated during the epoxy molding can be easily discharged. Each of the first supporters 9 comprise a first curved portion 9a with an inclined and downwardly bent portion, and a second curved portion 9b which is outwardly bent such that the end portion of each first supporter 9 remains horizontally level. The second curved portion 9b of the first supporter 9 is exposed through the lower surface of the epoxy molding compound 8.

Figure 7:
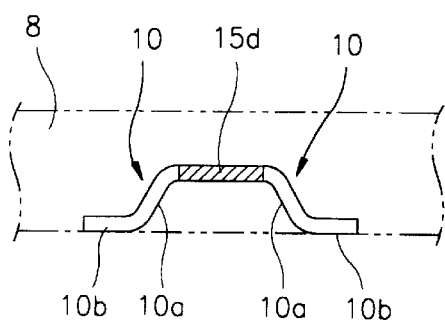
FIG. 7 is a cross-sectional view taken along the line VII—VII of FIG. 4.

The lead frame 12 of the present invention also includes improved tiebars (15a–15d) with second supporters 10 as shown in FIG. 7 showing a cross-sectional view taken along VII—VII of FIG. 4. Each second supporter 10 includes a first curved portion 10a which is downwardly bent, and a second curved portion 10b which is outwardly bent so that the outer end portion of the second supporter remains horizontally level. The second curved portions 10b of the second supporters 10 are exposed on the lower surface of the epoxy molding compound 8.

The semiconductor chip package fabrication process employing the lead frame 12 in accordance with the present invention includes the mounting, wire bonding and epoxy molding steps. Since the first and second supporters 9 and 10 of the lead frame 12 are exposed on the lower surface of the epoxy molding compound, to contact the bottom surface of the mold (not shown), the paddle maintains a constant horizontal level without any bending.

In the lead frame having supporters and a semiconductor chip package using the same in accordance with the present invention, the paddle is maintained horizontally level irrespective of the pressure of the molten epoxy molding compound being poured into the mold. The plurality of first and second supporters on the paddle and tiebars of the lead frame supports the paddle such that the paddle maintains a constant horizontal level without any bending.

Further, the steam generated inside the package can be easily dissipated along the interface between the lead frame having supporters and the epoxy molding compound, such that a cracking within the interior of the chip package can be prevented. Moreover, the heat generated in the package interior during the chip package operation can be readily dissipated through the metallic paddle, which has high thermal conductivity properties, and the supporters to the outside.

The foregoing embodiment is merely exemplary and not to be construed as limiting the present invention. The present scheme can be readily applied to other types of lead frames requiring a support structure. One of ordinary skill in the art can use the teachings of the present invention to other packages requiring supporting structures and improved heat dissipation. The description of the present invention is intended to be illustrative, and not limiting the scope of the claims. Many alternatives, modifications and variations will be apparent to those skilled in the art.

We claim:

1. A lead frame for an integrated chip package, comprising:

a paddle for mounting the integrated chip;

a plurality of tiebars connected to said paddle;

a plurality of leads for coupling to the integrated chip; and a plurality of supporters for preventing bending of said paddle such that said paddle is maintained on a substantially horizontal plane with said plurality of leads, wherein said supporters comprise a plurality of first supporters on each side of the paddle which extend outwardly from the side of the paddle, and each first supporter includes a first portion coupled to said paddle with a predetermined length which is bent in a prescribed direction from the paddle, and a second portion with a predetermined portion which is parallel with the horizontal plane of said paddle.

2. The lead frame of claim 1, wherein said prescribed direction is a downward direction with respect to a horizontal plane from said paddle.

3. The lead frame of claim 1, wherein said predetermined portion is substantially co-planar with an external surface of the integrated chip package.

4. A lead frame for an integrated chip package, comprising:

a paddle for mounting the integrated chip;

a plurality of tiebars connected to said paddle;

a plurality of leads for coupling to the integrated chip; and a plurality of supporters for preventing bending of said paddle such that said paddle is maintained on a substantially horizontal plane with said plurality of leads, wherein said supporters comprise a plurality of first supporters extending outwardly from each tiebar.

5. The lead frame of claim 4, wherein each first supporter includes a first portion coupled to a corresponding tiebar with a predetermined length which is bent in a prescribed direction from the corresponding tiebar, and a second portion with a predetermined portion which is parallel with the horizontal plane of said paddle.

6. The lead frame of claim 5, wherein said prescribed direction is a downward direction with respect to a horizontal plane from said tiebar.

7. The lead frame of claim 5, wherein said predetermined portion is substantially co-planar with an external surface of the integrated chip package.

8. An integrated chip package, comprising:

a) an integrated chip;

b) a lead frame having i) a paddle for mounting the integrated chip, ii) a plurality of tiebars connected to said paddle, iii) a plurality of leads, and iv) a plurality of supporters for preventing bending of said paddle such that said paddle remains substantially horizontal with said plurality of leads;

c) a plurality of conductors for coupling said integrated chip and said plurality of leads; and d) a body member for packaging said chip, lead frame and conductors.

9. The integrated chip package of claim 8, wherein said supporters comprise a plurality of first supporters on each side of the paddle.

10. The integrated chip package of claim 9, wherein each of said first supporters extends outwardly from the side of the paddle.

11. The integrated chip package of claim 10, wherein each first supporter includes a first portion coupled to said paddle with a predetermined length which is bent in a prescribed direction from the paddle, and a second portion with a predetermined portion which is parallel with the horizontal plane of said paddle.

12. The integrated chip package of claim 11, wherein said prescribed direction is a downward direction with respect to a horizontal plane from said paddle.

13. The integrated chip package of claim 11, wherein said predetermined portion is substantially co-planar with an external surface of said body member.

14. The integrated chip package of claim 8, wherein said supporters comprise a plurality of second supporters extending outwardly from each tiebar.

15. The integrated chip package of claim 14, wherein each second supporter includes a first portion coupled to a corresponding tiebar with a predetermined length which is bent in a prescribed direction from the corresponding tiebar, and a second portion with a predetermined portion which is parallel with the horizontal plane of said paddle.

16. The integrated chip package of claim 15, wherein said prescribed direction is a downward direction with respect to a horizontal plane from said tiebar.

17. The integrated chip package of claim 15, wherein said predetermined portion is substantially co-planar with an external surface of said body member.

18. A lead frame for a semiconductor package, comprising:

a rail on a peripheral location of the lead frame;

a paddle positioned in a center of the lead frame;

a plurality of tiebars connecting the paddle to the rail;

a plurality of leads each having one end thereof approaching the paddle and another end thereof connected to the rail; and a first supporter extended outwardly from each at least one side of the paddle, wherein the first supporters each include a first curved portion downwardly bent with respect to a horizontal plane so as to have a terrace shape therein, and a second curved portion bent outwardly so that an end portion thereof is horizontal with said paddle.

19. The lead frame of claim 18, further comprising a plurality of second supporters extending outwardly from each tiebar.

20. The lead frame of claim 19, wherein each of said plurality of second supporters comprises a first curved portion bent downwardly with respect to a horizontal plane so as to have a terrace therein, and a second curved portion bent outwardly so that an end portion remains horizontal with said tiebar.

21. A semiconductor chip package using a lead frame having supporters, comprising:

a semiconductor chip;

a lead frame including a rail, a paddle positioned in a center of said frame with a semiconductor chip mounted on a surface of the paddle, a plurality of tiebars connecting the paddle to the rail, a plurality of leads each having one end thereof approaching the paddle and having another end thereof connected to the rail, and a plurality of first supporters extended outwardly from each side of the paddle;

metallic wires electrically connecting the semiconductor chip and the plurality of leads; and an epoxy body structure packaging the semiconductor chip, the metallic wires and the plurality of leads, wherein a part of each of the first supporters on a lower surface thereof is exposed.

22. The semiconductor chip package of claim 21, wherein a plurality of second supporters are formed to extend outwardly and downwardly with respect to a horizontal plane on each side of the plurality of tiebars.

23. The semiconductor chip package of claim 22, wherein a part of each of the second supporters are exposed on the lower surface of the epoxy body structure.

24. A lead frame for an integrated chip package, comprising:

a paddle for mounting the integrated chip;

a plurality of tiebars connected to said paddle;

a plurality of leads for coupling to the integrated chip; and a plurality of supporters for preventing bending of said paddle such that said paddle is maintained on a substantially horizontal plane with said plurality of leads, wherein said supporters comprise at least one first supporter on at least two sides of said paddle.

25. The lead frame of claim 24, wherein the first supporters are arranged such that they are on opposite sides of the paddle.

26. The integrated chip package of claim 8, wherein said plurality of conductors are metallic wires.

27. The lead frame of claim 18, further comprising two first supporters on each side of said paddle, wherein said first supporters are positioned approximately at opposite ends of each side.

* * * * *